United States Patent
Koh

(10) Patent No.: US 6,759,287 B2
(45) Date of Patent: Jul. 6, 2004

(54) SEMICONDUCTOR DEVICE AND FABRICATION METHOD THEREOF

(75) Inventor: Kwan-Ju Koh, Bucheon (KR)

(73) Assignee: Anam Semiconductor, Inc. (KR)

( * ) Notice: Subject to any disclaimer, the term of this patent is extended or adjusted under 35 U.S.C. 154(b) by 0 days.

(21) Appl. No.: 10/435,270

(22) Filed: May 7, 2003

(65) Prior Publication Data

US 2003/0211696 A1 Nov. 13, 2003

(30) Foreign Application Priority Data

May 7, 2002 (KR) ................................ 10-2002-0025110

(51) Int. Cl.[7] ...................... H01L 21/338; H01L 31/119
(52) U.S. Cl. ...................... 438/182; 438/253; 438/396; 257/306; 257/313
(58) Field of Search ................................ 257/303, 306, 257/313; 438/158, 182, 253, 396, 574, 579, 595

(56) References Cited

U.S. PATENT DOCUMENTS 6,534,405 B1 * 3/2003 Wu ............................ 438/682
6,656,824 B1 * 12/2003 Hanafi et al. ................ 438/585

* cited by examiner

*Primary Examiner*—Caridad Everhart
*Assistant Examiner*—Calvin Lee
(74) *Attorney, Agent, or Firm*—Fulbright & Jaworski LLP

(57) ABSTRACT

A semiconductor device is provided that comprises a gate oxide film, a gate electrode, a nitride film, a low concentration impurity area, and a high concentration impurity are. The gate oxide film is formed on a semiconductor substrate. The gate electrode is formed on a predetermined region of the gate oxide film, and an upper portion thereof is wider than a lower portion thereof by a predetermined width. The nitride film is formed at a side of the lower portion of the gate electrode, and a width of the nitride film is equal to the predetermined width. The low concentration impurity area is formed within the semiconductor substrate except at a portion thereof under the lower portion of the gate electrode. The high concentration impurity area is formed within the semiconductor substrate except at a portion thereof under the lower portion of the gate electrode.

6 Claims, 3 Drawing Sheets

SEMICONDUCTOR DEVICE AND FABRICATION METHOD THEREOF

BACKGROUND OF THE INVENTION (a) Field of the Invention

The present invention relates to a semiconductor device and a fabrication method thereof, and more particularly to an LDD (Lightly Doped Drain) transistor and a fabrication method thereof.

(b) Description of the Related Art

Generally, as semiconductor devices have become more highly integrated, gate widths have become narrower so that an electric field focuses on a drain. This may increase intensity of an electric filed inside a depletion layer that is disposed in a drain of a channel. Accordingly, electrons are accelerated at a high speed, and the accelerated electrons collide with atoms so that an avalanche phenomenon occurs.

At this time, a portion of the accelerated electrons enter a gate oxide film and are captured therein, so that a critical voltage of a semiconductor device is changed. Therefore, a hot electron effect, which causes unstable operation of the semiconductor device, occurs.

Recently, in order to prevent such a hot electron effect, an LDD (Lightly Doped Drain) gate has been used, in which an oxide film or a nitride film remains in a side wall of a gate, and impurity ions are injected, and thereby a conjunction of a low concentration of impurity ions is formed.

Referring to FIGS. 1a and 1b, a method of fabricating the conventional LDD transistor will be explained.

First, a gate oxide film 2 is formed on an active area of a semiconductor substrate 1, and a poly-crystalline silicon layer is then deposited on the gate oxide film 2.

The poly-crystalline silicon layer is etched by a photolithography process to form a gate electrode 3 having a predetermined width. Then, using the gate electrode as a mask, a low concentration of impurity ions are injected into an active area of the semiconductor substrate 1 to form a low concentration impurity area 4, and thereby constituting a source and a drain.

A nitride film is deposited through a chemical vapor deposition process, and it is anisotropically etched through a method such as a reactive ion etching (RIE) method, and thereby a nitride film spacer 5 is formed on a side wall of the gate electrode 3.

Then, using the gate electrode 3 and the nitride film spacer 5 as a mask, a high concentration of impurity ions are injected into the active area of the semiconductor substrate 1, thereby forming a high concentration impurity area 6.

A thermal process is then performed in order to alleviate stress of the substrate 1 caused by the injection of impurity ions, and thereby a MOS device is formed.

However, along with a tendency of high integration of a semiconductor device, a critical dimension (CD) that is determined as a value calculated by summing a width of the gate electrode 3 and a width of the nitride film spacer 5 is also decreased.

Because of the decrease of the critical dimension, a width of a silicide that is formed over the gate electrode 3 is also decreased. Therefore, there is a problem in that resistance of the silicide becomes greater. As a semiconductor device becomes highly integrated, this problem becomes more serious. Thus, a method for decreasing the resistance of the silicide is urgently required.

Furthermore, there is another problem in that when the poly-crystalline silicon layer is etched by the photolithography process to form the gate electrode 3, a desired pattern of the gate electrode is occasionally not acquired. That is, a portion of the polycrystalline silicon (namely, a foot) in a horizontal direction at a lower portion of the side wall of the gate electrode 3 can remain, or the poly-crystalline silicon is over-etched so that a hollow portion (namely, a notch) can be formed. Because such a foot and notch may change a length of a channel, they disturb stable operation of the device.

Still furthermore, there is a problem in that it is quite difficult to regulate a width of the spacer when the nitride film is anisotropically etched in order to form the nitride film spacer.

SUMMARY OF THE INVENTION

The present invention has been made in an effort to solve the above problems.

It is a motivation of the present invention to provide an LDD MOS transistor in which resistance of a silicide has been decreased, and a fabrication method thereof.

Another motivation of the present invention is to decrease a foot or a notch in a gate electrode, in order to prevent a malfunction of a semiconductor device.

Still another motivation of the present invention is to downsize an LDD MOS transistor.

In a preferred embodiment of the present invention, the semiconductor device comprises a gate oxide film, a gate electrode, a nitride film, a low concentration impurity area, and a high concentration impurity area. The gate oxide film is formed on a semiconductor substrate. The gate electrode is formed on a predetermined region of the gate oxide film, and an upper portion thereof is wider than a lower portion thereof by a predetermined width. The nitride film is formed at a side of the lower portion of the gate electrode, and a width thereof is equal to the predetermined width. The low concentration impurity area is formed within the semiconductor substrate except at a portion thereof under the lower portion of the gate electrode. The high concentration impurity area is formed within the semiconductor substrate except at a portion thereof under the lower portion of the gate electrode.

It is preferable that the gate electrode is made of a poly-crystalline silicon.

It is also preferable that an upper surface of the gate electrode is level.

Preferably, a side surface of the upper portion of the gate electrode and a side surface of the nitride film form one straight line.

It is preferable that the semiconductor device is a lightly doped drain (LDD) MOS transistor.

In another preferred embodiment of the present invention, the method for fabricating a semiconductor device comprises: forming a gate oxide film on a semiconductor substrate; forming a first photo-resist film pattern having a predetermined width on the gate oxide film, and then injecting a low concentration of impurity ions into an exposed portion of the semiconductor substrate by using the photo-resist film pattern as a mask; removing the first photo-resist film pattern, and forming a nitride film pattern on the gate oxide film except at a portion where the first photo-resist film pattern was positioned so that the nitride film pattern is provided with an opened portion; forming a poly-crystalline silicon layer over all the nitride film pattern and an exposed portion of the gate oxide film; partially etching the poly-crystalline silicon layer and the nitride film pattern such that an end portion having a predetermined width of the nitride film pattern near the opened portion thereof remains, and a portion of the poly-crystalline silicon layer over the exposed gate oxide film and over the remained portion of the nitride film pattern remains; and injecting a high concentration of impurity ions into the semiconductor substrate by using the nitride film pattern and the poly-crystalline silicon layer that remain after etching, as a mask.

It is preferable that the step of partially etching the poly-crystalline silicon layer and the nitride film pattern comprises: etching the poly-crystalline silicon layer such that a portion of the poly-crystalline silicon layer on the exposed portion of the gate oxide film and a portion of the poly-crystalline silicon layer over some portion of the nitride film pattern near the opened portion thereof remain; and etching the nitride film pattern by using the remaining poly-crystalline silicon layer as a hard mask.

Preferably, in the step of etching the nitride film pattern, the etching is carried out under a condition in that the nitride film pattern is more easily etched than the polycrystalline silicon layer.

It is also preferable that after the step of etching the nitride film, an upper surface of the poly-crystalline silicon layer is leveled.

It is preferable that the nitride film pattern is formed over all the gate oxide film, a second photo-resist film pattern whose phase is opposite to that of the first photo-resist film pattern is formed, and then the exposed nitride film pattern is etched by using the second photo-resist film pattern as a mask.

Preferably, in the step of injecting a high concentration of impurity ions, a cap oxide film is formed over all the semiconductor substrate, and a high concentration of impurity ions are then injected from an upper portion of the cap oxide film.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

Preferred embodiments of the present invention will now be described in detail with reference to the accompanying drawings.

FIGS. 2a to 2g are schematic cross-sectional views showing a semiconductor device fabrication method according to a preferred embodiment of the present invention.

Figure 1A:
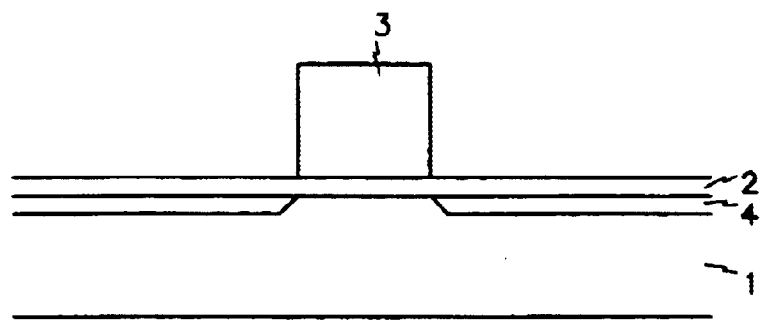
FIGS. 1a and 1b are schematic cross-sectional views showing a method for fabricating a conventional semiconductor device.
Figure 1B:
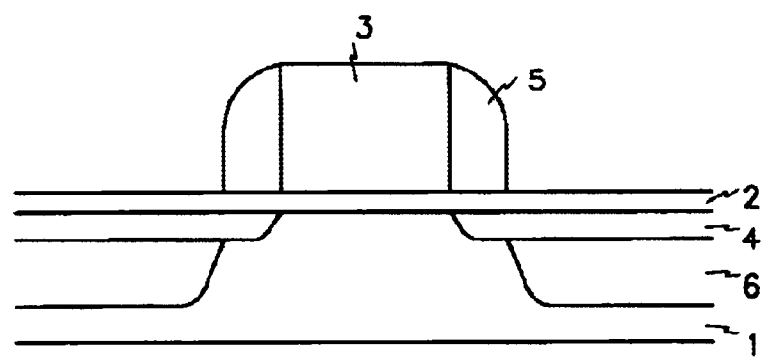
Figure 2A:
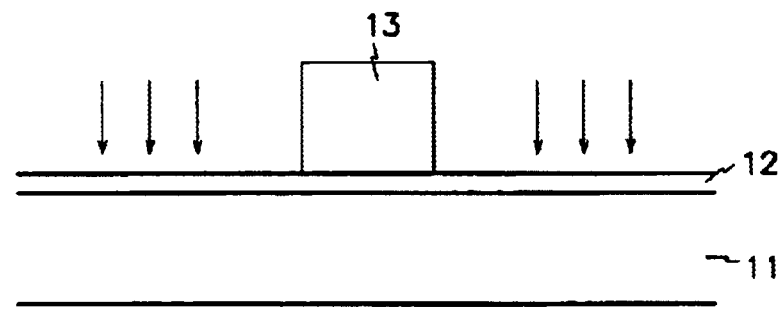
FIGS. 2a to 2g are schematic cross-sectional views showing a semiconductor device fabrication method according to a preferred embodiment of the present invention.
Figure 2B:
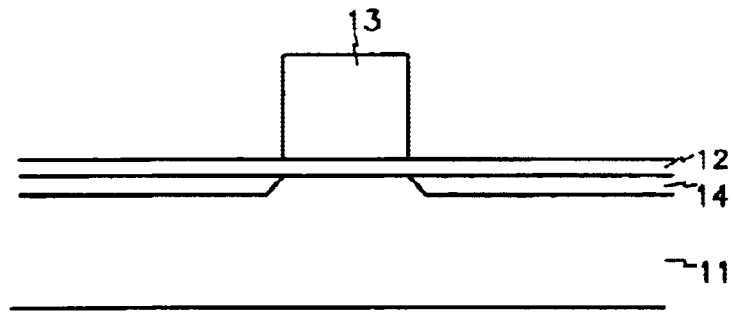
Figure 2C:
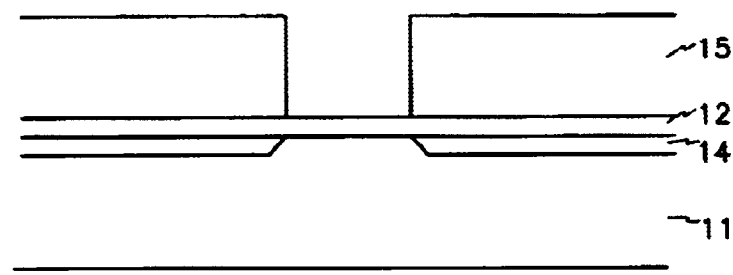
Figure 2D:
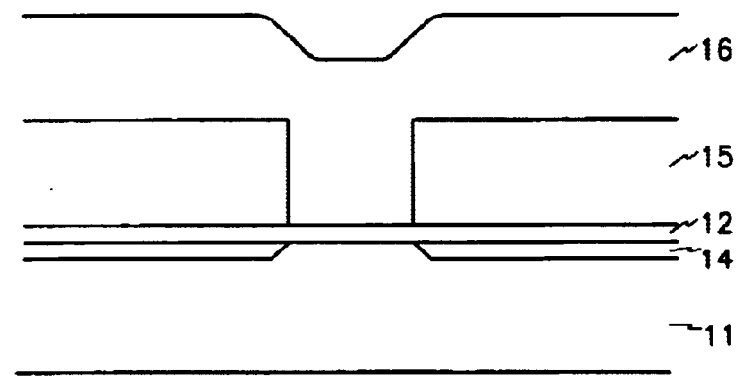
Figure 2E:
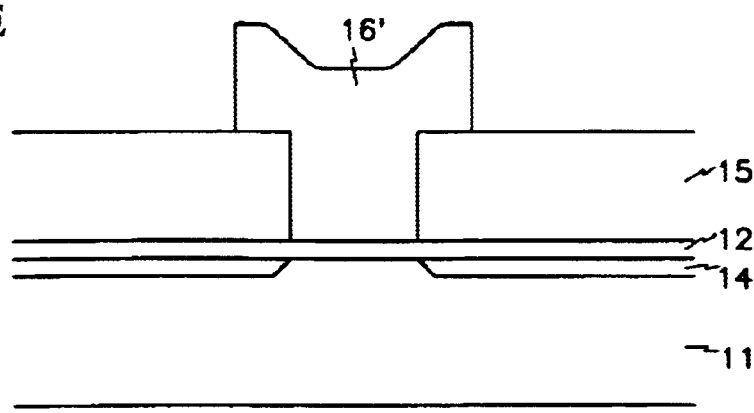
Figure 2F:
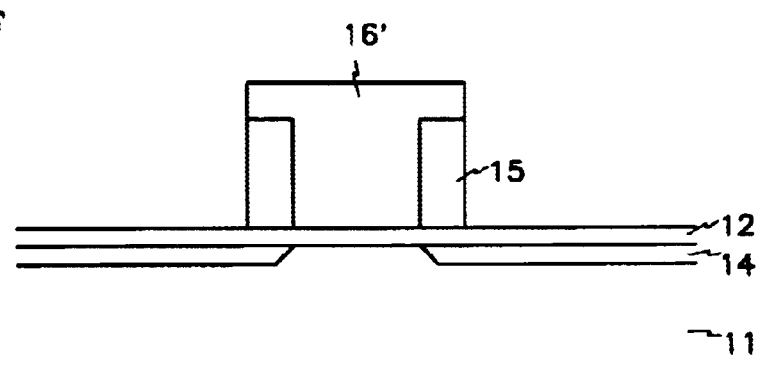
Figure 2G:
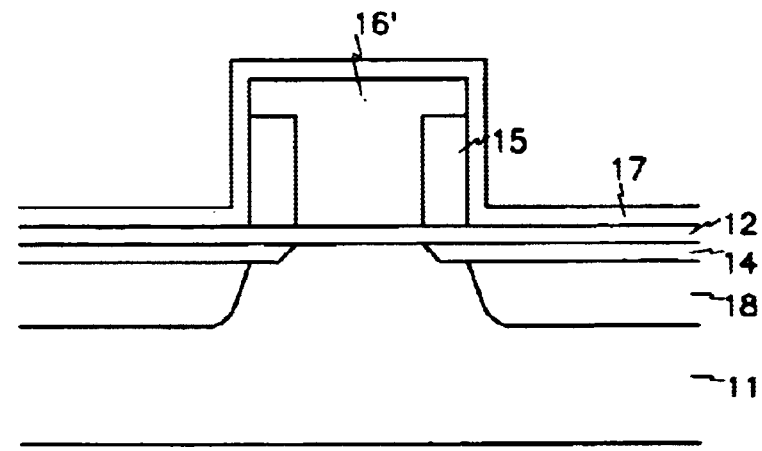

As shown in FIG. 2g, a semiconductor device according to the preferred embodiment of the present invention does not include a nitridespacer on a sidewall of a gate electrode. A nitride film 15 having a predetermined width and a predetermined thickness is disposed in a side wall of a gate electrode 16' such that an end surface of an assembly of the gate electrode 16' and the nitride film 15 is substantially vertical. That is to say, the width of an upper portion of the gate electrode 16' is stepped wider than that of a lower portion thereof by a predetermined width, and the nitride film 15 is disposed adjacent to the lower portion of the gate electrode 16'.

Under such structure, a conventional critical dimension, which is the sum of the width of the conventional gate electrode and the width of the conventional nitride spacer, is equal to a width of the upper potion of the gate electrode 16', and a width of a conventional gate electrode corresponds to a width of the lower portion of the gate electrode 16'.

Because the width of the upper portion of the gate electrode is wider than that of the lower portion thereof, there is an advantage in that resistance of silicide on the gate electrode decreases.

Referring to FIGS. 2a to 2g, the semiconductor device fabrication method according to the preferred embodiment of the present invention will be explained in detail hereinafter.

At first, as shown in FIG. 2a, a gate oxide film 12 is formed on a semiconductor substrate 11, and a first photo-resist film pattern 13 having a predetermined width is formed on the gate oxide film 12. Then by using the first photo-resist film pattern 13 as a mask, a low concentration of impurity ions are injected, thereby forming a low concentration impurity area 14 in an active area of the semiconductor substrate 11 except at a portion of the substrate 11 under the first photo-resist film pattern 13, as shown in FIG. 2b.

The first photo-resist film pattern 13 is then removed, and a nitride film is deposited on the gate oxide film 12. Then, a second photo-resist film pattern (not shown) is formed on the nitride film such that an area where the first photo-resist film pattern 13 was located can be exposed. In other words, the second photo-resist film pattern corresponds to a reverse pattern whose phase is opposite to that of the first photo-resist film pattern 13.

By using the second photo-resist film pattern as a mask, an exposed portion of the nitride film is etched to form a nitride film pattern 15 as shown in FIG. 2c. As shown in FIG. 2d, a poly-crystalline silicon layer 16 is formed over all the nitride film pattern 15 and the exposed portion of the gate oxide film 12 through an opened portion of the nitride film pattern 15, by a chemical vapor deposition process.

A third photo-resist film pattern (not shown) is then formed on the polycrystalline silicon layer 16 such that it covers the opened portion of the nitride film pattern 15 and a predetermined width of the nitride film pattern near the opened portion. Then, by using the third photo-resist film pattern as a mask, an exposed portion of the poly-crystalline silicon layer 16 is etched to form a gate electrode 16' as shown in FIG. 2e.

Next, by using the gate electrode 16' as a hard mask and using an etching selection ratio of the poly-crystalline silicon layer that constitute the gate electrode and the nitride film, that is, under a condition in that the nitride film is more easily etched than the poly-crystalline silicon layer, an exposed portion of the nitride film pattern 15 that is not covered by the gate electrode 16' is etched, and an upper surface of the gate electrode 16' is then leveled, as shown in FIG. 2f. Accordingly, nitride films 15 having a predetermined width and a predetermined thickness are disposed at both sides of a lower portion of the gate electrode 16'.

Therefore, because side faces of the lower portion of the gate electrode 16' are not etched, a foot or a notch does not occurred.

Furthermore, as the gate electrode 16' with the nitride films 15 on both sides thereof and having a desired predetermined width is formed through a photolithography process, it is possible to regulate a width of the gate electrode 16' as desired. Therefore, it is easy to regulate the critical dimension.

A cap oxide film 17 is, as shown in FIG. 2g, then formed over all the gate electrode 16' and the gate oxide film 12, and a high concentration of impurity ions are injected from an upper portion of the cap oxide film to form a high concentration impurity area 18 within an active area of the substrate 11 except at a portion of the substrate under the gate electrode 16'.

In the semiconductor device according to the preferred embodiment of the present invention, the upper portion of the gate electrode is wider than the lower portion thereof, and therefore resistance of the silicide over the gate electrode decreases.

Furthermore, in the semiconductor device according to the preferred embodiment of the present invention, a foot or a notch at the side faces of the lower part of the gate electrode does not occurred. Therefore, a change of a length of a channel caused by the foot or the notch can be prevented, and thereby stable operation of the device can be achieved.

Still furthermore, in the semiconductor device according to the preferred embodiment of the present invention, because the gate electrode can be formed in a desired pattern, it is easy to regulate the critical dimension, so it is also easy to accomplish high integration of the device.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method for fabricating a semiconductor device, comprising the steps of:

(a) forming a gate oxide film on a semiconductor substrate;

(b) forming a first photo-resist film pattern having a predetermined width on the gate oxide film, and then injecting a low concentration of impurity ions into an exposed portion of the semiconductor substrate by using the photo-resist film pattern as a mask;

(c) removing the first photo-resist film pattern, and forming a nitride film pattern on the gate oxide film except at a portion where the first photo-resist film pattern was positioned so that the nitride film pattern is provided with an opened portion;

(d) forming a poly-crystalline silicon layer on the nitride film pattern and an exposed portion of the gate oxide film;

(e) partially etching the poly-crystalline silicon layer and the nitride film pattern such that an end portion having a predetermined width of the nitride film pattern near the opened portion thereof remains, and a portion of the poly-crystalline silicon layer on the exposed gate oxide film and on the remaining portion of the nitride film pattern remains; and (f) injecting a high concentration of impurity ions into the semiconductor substrate by using the nitride film pattern and the poly-crystalline silicon layer that remain after the step of (e), as a mask.

2. The method for fabricating a semiconductor device of claim 1, wherein the nitride film pattern is formed over all the gate oxide film, a second photo-resist film pattern whose phase is opposite to that of the first photo-resist film pattern is formed, and then the exposed nitride film pattern is etched by using the second photo-resist film pattern as a mask.

3. The method for fabricating a semiconductor device of claim 1, wherein the step of (e) partially etching the poly-crystalline silicon layer and the nitride film pattern comprises:

etching the poly-crystalline silicon layer such that a portion of the polycrystalline silicon layer on the exposed portion of the gate oxide film and a portion of the poly-crystalline silicon layer on a predetermined portion of the nitride film pattern near the opened portion thereof remain; and etching the nitride film pattern by using the remaining poly-crystalline silicon layer as a hard mask.

4. The method for fabricating a semiconductor device of claim 3, wherein in the step of etching the nitride film pattern, the etching is carried out under a condition in that the nitride film pattern is more easily etched than the poly-crystalline silicon layer.

5. The method for fabricating a semiconductor device of claim 4, wherein after the step of etching the nitride film, an upper surface of the poly-crystalline silicon layer is leveled.

6. The method for fabricating a semiconductor device of claim 1, wherein in the step of (f) injecting a high concentration of impurity ions, a cap oxide film is formed over all the semiconductor device, and a high concentration of impurity ions are then injected from an upper portion of the cap oxide film.

* * * * *